United States Patent
Negishi

(10) Patent No.: US 7,382,146 B2
(45) Date of Patent: Jun. 3, 2008

(54) SEMICONDUCTOR TESTING APPARATUS

(75) Inventor: Toshiyuki Negishi, Tokyo (JP)

(73) Assignee: Advantest Corporation, Tokyo (JP)

( * ) Notice: Subject to any disclaimer, the term of this patent is extended or adjusted under 35 U.S.C. 154(b) by 174 days.

(21) Appl. No.: 11/428,831

(22) Filed: Jul. 5, 2006

(65) Prior Publication Data

US 2007/0011634 A1    Jan. 11, 2007

(30) Foreign Application Priority Data

Jul. 7, 2005   (JP) .............................. 2005-198594

(51) Int. Cl.
*G01R 31/02*   (2006.01)
(52) U.S. Cl. ..................................... 324/763
(58) Field of Classification Search ........ 324/760–765, 324/158.1; 365/93, 194; 327/136, 149, 327/153, 401–403
See application file for complete search history.

(56) References Cited

U.S. PATENT DOCUMENTS 5,488,325 A * 1/1996 Sato et al. ................... 327/286
7,123,540 B2 * 10/2006 Byun ......................... 365/194

* cited by examiner

*Primary Examiner*—Ha Tran Nguyen
*Assistant Examiner*—Tung X Nguyen
(74) *Attorney, Agent, or Firm*—patenttm.us

(57) ABSTRACT

Intends to provide semiconductor testing apparatus that can reduce effort to adjust generating timing of a clock signal to be extracted from data or a time required in adjustment. It includes a timing comparator 154 for receiving data outputted from a DUT 200; a clock generating circuit 120 for generating a clock signal synchronized with data outputted from the DUT 200; an absolute amount of delay calculating unit for calculating a signal propagating time corresponding to a difference between a first signal line from the DUT 200 to the timing comparator 154 and a second signal line to the clock generating circuit 120 as an absolute amount of delay; and an amount of delay setting unit for setting the amount of delay under a period of the clock signal according to a frequency or a period of the clock signal generated by the clock generating circuit 120 and ordering adjustment of the clock signal generating timing by the clock generating circuit 120.

8 Claims, 4 Drawing Sheets

SEMICONDUCTOR TESTING APPARATUS

BACKGROUND OF THE INVENTION

1. Field of the Invention

The present invention relates to semiconductor testing apparatus for determining whether a device under test is good or bad based on data outputted from the device under test.

2. Description of the Related Art

Pin electronics of semiconductor testing apparatus includes a comparator which captures a signal outputted from a device under test according to a strobe signal. The comparator does operation of capturing a signal synchronized with a rise (or a fall) of a strobe signal. As a time length of a signal line of each input/output pin of the device under test varies, rise timing of a strobe signal to be inputted into the comparator deviates from expected timing in an initial state. As a result, before various tests are performed on a device under test, timing calibration is performed (for example, see Japanese Patent Laid-Open No. 2-62983). With such timing calibration being performed, influence from variation in a time length of a signal line can be removed.

A semiconductor device for a high-speed serial interface that regenerates a clock signal embedded in received data and performs data receiving operation being synchronized with the regenerated clock signal has become practical recently. Such data of a clock embedded type high-speed serial interface is allowed for an uncertain width of predetermined sized timing (jitter). The conventional semiconductor testing apparatus mentioned above, however, adjusts variation in a time length of a signal line by assuming that an output timing of data is fixed, it cannot correspond to such a semiconductor device. That is to say, when output timing of data is shifted due to jitter, generating timing of a strobe signal needs to be shifted by an amount corresponding to the jitter, but conventional semiconductor testing apparatus cannot do such an adjustment.

If a clock signal can be accurately extracted from data, it is considered that generating timing of such a strobe signal can be adjusted in accord with generating timing of the clock signal. However, as variation practically occurs also in a time length of a signal line to be used for extracting a clock signal from data, a mechanism for adjusting the variation is needed. Also when a time length of the signal line exceeds a length of integer multiples of a period of a clock signal, a value corresponding to what exceeding the length will be adjusted. The adjustment value needs to be set anew for each time the frequency of the clock signal is changed. That makes the adjustment operation troublesome. Therefore, semiconductor testing apparatus that can reduce effort to adjust generating timing of a clock signal extracted from data or a time required in adjustment has been needed.

SUMMARY OF THE INVENTION

The present invention is created in view of such a point, and intends to provide semiconductor testing apparatus that can reduce effort to adjust generating timing of a clock signal to be extracted from data or a time required in adjustment.

The semiconductor testing apparatus of the present invention includes a receiving unit for receiving data outputted from a device under test; a clock generating unit for generating a clock signal synchronized with data outputted from the device under test; an absolute amount of delay calculating unit for calculating a signal propagating time corresponding to a difference between a first signal line from the device under test to the receiving unit and a second signal line from the device under test to the clock generating unit as an absolute amount of delay; and an amount of delay setting unit for setting the amount of delay under a period of the clock signal according to a frequency or a period of the clock signal generated by the clock generating unit and ordering adjustment of the clock signal generating timing by the clock generating unit. If the absolute amount of delay can be known, the amount of delay required for adjusting a clock signal generating timing can be known by calculation when a frequency or a period of a clock signal is changed. Therefore, it can substantially reduce effort to adjust clock signal generating timing to be extracted from data or a time required in adjustment.

It further includes a phase difference data obtaining unit for obtaining a first phase difference data P1 indicating a phase difference between output timing of the data which is generated when a first clock signal having a first frequency or a first period is generated by the clock generating unit and the first clock signal generating timing, and a second phase difference data P2 indicating a phase difference between output timing of the data which is generated when a second clock signal having a second frequency or a second period which is different from the first frequency or the first period is generated by the clock generating unit and the second clock signal generating timing, wherein the absolute amount of delay calculating unit preferably calculates the absolute amount of delay based on the first and second phase difference data P1, P2 obtained by the phase difference data obtaining unit and the first and second frequencies or the first and second periods. The absolute amount of delay can be calculated only when two kinds of clock signals are actually generated and phase difference data is obtained. That can reduce effort and time to actually generate a clock signal and set the amount of delay each time when a frequency or a period of a clock signal is changed thereafter.

The absolute amount of delay calculated by the above-mentioned absolute amount of delay calculating unit is preferably stored in an absolute amount of delay storing unit consisting of non-volatile memory. That enables data of once calculated absolute amount of delay to be saved and used in each time of setting the amount of delay, so that it can further reduce effort and time in setting the amount of delay.

Preferably it further includes a phase comparing unit for detecting a phase difference of signals inputted into two input terminals, wherein data outputted from the device under test is inputted into an input terminal and the first and second clock signals generated by the clock generating unit are inputted into the other input terminal; and a phase difference outputting unit for outputting a value corresponding to the phase difference detected by the phase comparing unit, and wherein the phase difference data obtaining unit obtains the first and second phase difference data based on an outputted value from the phase difference outputting unit. Specifically, the phase difference outputting unit preferably consists of a counter for performing up-count operation or down-count operation according to a phase difference detected by the phase comparing unit and outputs a count value depending on the phase difference. That enables a value according to a phase difference between data and a clock signal to be obtained easily and certainly.

The clock generating unit preferably includes a PLL synthesizer for generating the clock signal, and an adding unit for superimposing a voltage depending on an outputted value from the phase difference outputting unit on a control voltage to be applied to a voltage controlling oscillator in the PLL synthesizer. That can set a clock signal generating timing to keep a phase difference corresponding to a difference between a first signal line and a second signal line so that a value according to the phase difference can be obtained in a stable state.

The absolute amount of delay calculating unit preferably compares the size of the first and second phase difference data P1, P2, and calculates the absolute amount of delay according to the result of the comparison. Alternatively, the absolute amount of delay calculating unit preferably calculates the absolute amount of delay by comparing the size of the first and second phase difference data P1, P2 and obtaining a quotient resulted from division of the absolute amount of delay by a period of the first or second clock signal according to the result of the comparison. By using an appropriate calculating expression depending on relationship in size of the first and the second phase difference data P1, P2, the absolute amount of delay can be correctly and easily calculated by using the phase difference data P1, P2.

DETAILED DESCRIPTION OF THE PREFERRED EMBODIMENTS

Figure 1:
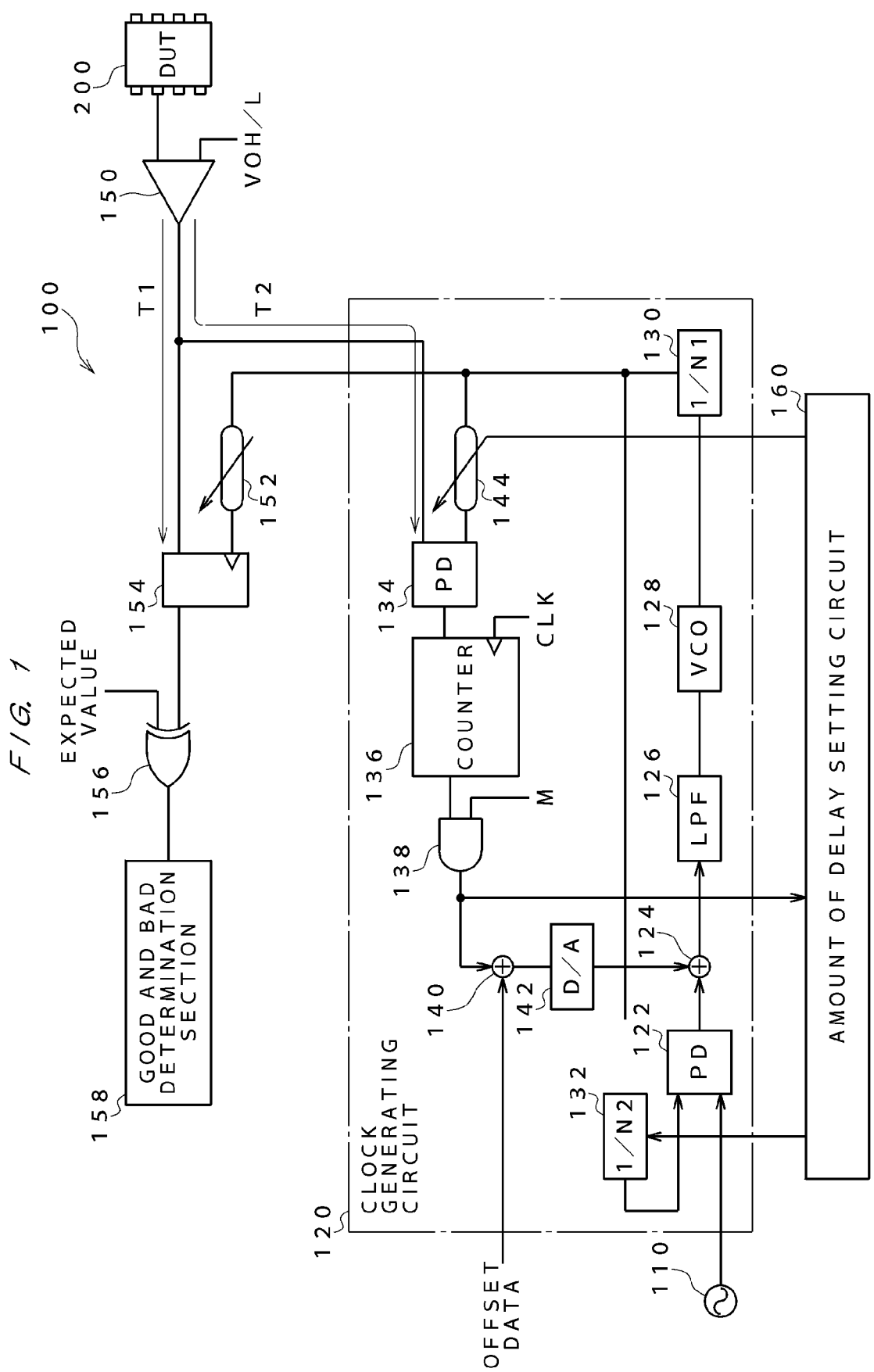
FIG. 1 is a diagram showing a partial configuration of semiconductor testing apparatus of an embodiment.

The semiconductor testing apparatus of an embodiment applied with the present invention will be described below in detail with reference to the drawings. FIG. 1 is a diagram showing a partial configuration of semiconductor testing apparatus of an embodiment. As shown in FIG. 1, a semiconductor testing apparatus 100 of the embodiment includes a reference clock source 110, a clock generating circuit 120, a level comparator 150, a variable delay circuit 152, a timing comparator 154, a logical comparing device 156, a good and bad determination section 158, and an amount of delay setting circuit 160. The good and bad determination unit 158 may be realized by a CPU included in the semiconductor testing apparatus 100 executing a program, or may be realized by using an analyzing device such as a workstation provided outside the semiconductor testing apparatus 100.

The reference clock source 110 generates a reference clock signal for controlling operation of a device under test (hereinafter, referred to as DUT) 200. For example, a reference clock signal of 250.25 MHz is generated by the reference clock source 110. The semiconductor testing apparatus 100 includes a timing generator, a pattern generator, a waveform shaping section and the like (not shown). Pattern data to be inputted into the DUT 200 is created with these components. The DUT 200 outputs data corresponding to the pattern data. The level comparator 150 compares outputted data from the DUT 200 and a preset threshold voltage, then outputs a two-valued signal (high/low) according to the result of the comparison. The clock generating circuit 120 generates a regenerative clock signal which synchronizes with the reference clock signal outputted from the reference clock source 110.

The variable delay circuit 152 generates a strobe signal by delaying the regenerative clock signal generated by the clock generating circuit 120. The amount of delay of the variable delay circuit 152 is set corresponding to the specification of the DUT 200. For example, the amount of delay of the variable delay circuit 152 is half a period time of outputted data from the DUT 200. It is assumed that variation of a time length of a signal line from the DUT 200 to a timing comparator 154 is previously adjusted by using the variable delay circuit 152 (the adjustment can be performed by conventional timing calibration).

The timing comparator 154 obtains the outputted value from the level comparator 150 based on the strobe signal inputted via the variable delay circuit 152. The logical comparing device 156, which is formed by using an XOR circuit, for example, compares an outputted value obtained by the timing comparator 154 with a preset expected value, then outputs fail data or pass data corresponding to the result of the comparison. The good and bad determination unit 158 determines whether the DUT 200 is good or bad based on the result of the comparison (fail/pass data) of the logical comparing device 156. The amount of delay setting circuit 160 sets the amount of delay of a variable delay circuit 144 provided in the clock generating circuit 120. The setting of amount of delay will be detailed later.

Next, the clock generating circuit 120 will be detailed. As shown in FIG. 1, the clock generating circuit 120 includes phase comparing devices (PD) 122, 134, adders 124, 140, a low pass filter (LPF) 126, a voltage controlling type oscillator (VCO) 128, dividers 130, 132, a counter 136, an AND circuit 138, a digital/analog converter (D/A) 142, and a variable delay circuit 144.

The phase comparing device 122 compares the phase of the reference clock signal outputted from the reference clock source 110 and a signal outputted from the divider 132, and outputs a signal having a duty according to the phase difference. The adder 124 adds an outputted voltage of the digital/analog converter 142 to a voltage of an outputted signal from the phase comparing device 122. For example, assuming that an outputted value of the digital/analog converter 142 is allowed to vary in a range of −Vm to +Vm, a voltage value corresponding to the high/low level of the outputted signal from the phase comparing device 122 is previously set narrower than a range of a power source voltage in consideration of a value of the ±Vm. As a result, a voltage value as the result of addition by the adder 124 is adapted not to exceed a range of a power source voltage.

The low pass filter 126 generates a controlling voltage to be applied to the voltage controlling type oscillator 128 by smoothing a voltage outputted from the adder 124. The voltage controlling type oscillator 128 performs oscillating operation by using a frequency corresponding to an applied control voltage. The divider 130, to which a fixed dividing ratio N1 is set, divides an oscillation signal outputted from the voltage controlling type oscillator 128 by a dividing ratio N1. The divider 132, to which a variable dividing ratio N2 is set, further divides a signal outputted from the divider 130 by a dividing ratio N2 and outputs it. As mentioned above, an outputted signal from the divider 132 is inputted into the phase comparing device 122.

The variable delay circuit 144 delays the outputted signal from the divider 130 by a predetermined amount of delay and outputs it. The phase comparing device 134 compares the phase of a signal passed through the variable delay circuit 144 and an outputted signal from the level comparator 150, then outputs a signal having a duty according to a phase difference. The counter 136 is an up/down counter for performing up-count operation or down-count operation according to the outputted signal from the phase comparing device 134. For example, when an outputted signal from the phase comparing device 134 is in a high level, up-count operation synchronized with a clock signal CLK is performed. To the contrary, when the outputted signal from the phase comparing device 134 is in a low level, down-count operation synchronized with a clock signal CLK is performed. As a result, a count value included in a range of −64-+64, for example, is outputted from the counter 136, according to a duty ratio of the outputted signal from the phase comparing device 134. As for the AND circuit 138, an outputted signal (count value) from the counter 136 is inputted into an input terminal and a mode signal M is inputted into the other input terminal, and the outputted value from the counter 136 is masked when the mode signal M is in a low level and the outputted value from the counter 136 is outputted as it is when the mode signal M is in a high level. The AND circuit 138 is provided corresponding to each bit of a parallel output terminal of the counter 136.

The adder 140 adds a count value outputted from the counter 138 and offset data. The digital/analog converter 142 outputs an analog voltage corresponding to data as a result of addition outputted from the adder 140. As mentioned above, the outputted voltage is inputted into the adder 124.

The abovementioned timing comparator 154 corresponds to a receiving unit, the clock generating circuit 120 corresponds to a clock generating unit, an absolute amount of delay calculating section 166 corresponds to an absolute amount of delay calculating unit, an amount of delay setting section 170 corresponds to an amount of delay setting unit, a phase difference data obtaining section 164 corresponds to a phase difference data obtaining unit, an absolute amount of a delay storing section 168 corresponds to an absolute amount of delay storing unit, the phase comparing devise 134 corresponds to a phase comparing unit, the counter 136 corresponds to a phase difference outputting unit, and the adder 124 corresponds to an adding unit, respectively. The PLL synthesizer consists of the phase comparing device 122, the low pass filter 126, the voltage controlling type oscillator 128, and the dividers 130, 132.

The semiconductor testing apparatus 100 of the embodiment has such a configuration. Next, its operation will be described.

(1) Basic Operation of the Clock Generating Circuit 120 (I)

First, basic operation for generating a regenerative clock signal by using a controlling loop (frequency synthesizer) consisting of the phase comparing device 122, the voltage controlling type oscillator 128, and dividers 130, 132 will be described. For example, it is assumed that a mode signal M is set to a low level and an outputted value from the counter 136 is masked by the AND circuit 138. It is also assumed that offset data to be inputted to the adder 140 is also 0. That is to say, it is assumed that an outputted voltage from the digital-analog converter 142 is 0V, and at the adder 124, the outputted voltage from the phase comparing device 122 is inputted as it is into the low pass filter 126.

A signal of an outputted voltage of the voltage controlling type oscillator 128 divided with the dividing ratios N1 and N2 is inputted into an input terminal of the phase comparing device 122, and a reference clock signal outputted from the reference clock source 110 is inputted into the other input terminal. In the controlling loop, the frequencies and the phases of two input signals of the phase comparing device 122 are controlled to match. Accordingly, the voltage controlling type oscillator 128 is in predetermined phase relationship with the reference clock signal and executes oscillating operation with the frequency N1×N2 times the frequency of the reference clock signal. The divider 130 divides the oscillation signal by the dividing ratio N1, and the divided signal is outputted from the clock generating circuit 120 as a regenerated clock signal.

As mentioned above, the regenerated clock signal is inputted into the timing comparator 154 as a strobe signal via the variable delay circuit 152. The variation in a time length of a signal line of the strobe signal is adjusted by varying the amount of delay of the variable delay circuit 152. In actual test operation on the DUT 200, it is required to detect the timing of when the level of the outputted signal from the level comparator 150 changes by shifting an input timing of the strobe signal is shifted forward or backward. In such a case, a value of offset data to be inputted into the adder 140 only needs to be changed. When the offset data is changed, a voltage value outputted from the digital/analog converter 142 changes according to the offset data. Accordingly, only a phase in a state where an oscillating frequency of the voltage controlling type oscillator 128 is kept, i.e. only a rising (or falling) timing of the regenerated clock signal can be changed, and a generating timing of a strobe signal can be shifted.

(2) Basic Operation of the Clock Generating Circuit 120 (II)

Next, operation for generating a regenerative clock signal synchronized with data outputted from the DUT 200 will be described. When such a regenerative clock signal is generated, a mode signal M is set in a high level.

The outputted signal from the level comparator 150 is directly inputted into the timing comparator 154, and also branched and inputted into the phase comparing device 134 in the clock generating circuit 120. Time lengths of the two signal lines (propagation times of the signals) are called T1, T2, respectively. As the time lengths T1, T2 usually do not match, the variable delay circuit 144 is provided for adjusting the time difference Td (=T2−T1). If the time difference Td is longer than a period of the regenerative clock signal, a value corresponding to the time length exceeding a value of integer multiples of the regenerative clock signal is set in the variable delay circuit 144.

The amount of delay of the variable delay circuit 144 is set according to the procedure below. First, the amount of delay of the variable delay circuit 144 is set to 0. In this state, if generating timing of a regenerative clock signal outputted from the divider 130 deviates from timing of the outputted signal of the level comparator 150 (correctly, timing when a regenerative clock signal outputted from the divider 130 is inputted into the phase comparing device 134 and timing when data outputted from the level comparator 150 is inputted into the phase comparing device 134 deviate from each other), a duty ratio of an outputted signal of the phase comparing device 134 becomes a value corresponding to the deviation. Therefore, up-count operation or down-count operation by the counter 136 increases by an amount of the duty ratio deviated over 50%, and the counter value displaces to a positive side or a negative side from 0. The count value is converted into an analog voltage by the digital-analog converter 142 and inputted into the adder 124, and generation of the regenerative clock signal continues with a phase difference according to the analog voltage kept (corresponding to a difference between output timing of data and generating timing of the regenerative clock signal).

As a difference between output timing of data and generating timing of a regenerative clock signal corresponds to the count value of the counter 136, the amount of delay setting circuit 160 can recognize how much the generating timing of the regenerative clock signal deviates from the output timing of data at the moment by obtaining the count value of the counter 136. The amount of delay setting circuit 160 sets generating timing of the regenerative clock signal so as to match with an output timing of data by setting the amount of delay according to the count value of the counter 136 to the variable delay circuit 144. In this manner, the amount of delay corresponding to the time difference of two signal lines (a difference between time lengths of two signal lines) Td can be set to the variable delay circuit 144. Thereafter, as the regenerative clock signal is also generated at the timing of data outputted from the level comparator 150. Therefore, even if output timing of data fluctuates, the generating timing of the regenerative clock signal can also be changed according to the fluctuation.

(3) Setting Operation Based on a Result of Measurement of an Absolute Amount of Delay The abovementioned setting of the amount of delay of the variable delay circuit 144 needs to be done each time when the frequency of the regenerative clock signal is changed. This is because setting of the amount of delay corresponding to the time difference Td of two signal lines is performed for a value corresponding to a time length exceeding the value of integer multiples of the period of the regenerative clock signal. That is to say, if the amount of delay ΔT of the variable delay circuit 144 corresponding to the regenerative clock signal of a certain frequency f1 is known but the frequency changes from f1 to f2, the amount of delay of the variable delay circuit 144 corresponding to a regenerative clock signal of the changed frequency f2 cannot be obtained from the amount of delay ΔT. Therefore, it is required to do again the setting operation from the beginning. In such condition, when a frequency of the regenerative clock signal is desired to be frequently changed, operation for setting the amount of delay of the variable delay circuit 144 (calibration operation) is needed every time and effort and time for adjusting generating timing of a regenerative clock signal are required.

Then, a method for reducing the abovementioned effort or time by first obtaining the abovementioned time difference Td (hereinafter, the Td is referred to as an absolute amount of delay), and when a frequency of the regenerative clock signal is changed, obtaining the amount of delay ΔT by calculation based on the obtained absolute amount of delay Td and setting the variable delay circuit 144 will be described.

Figure 2:
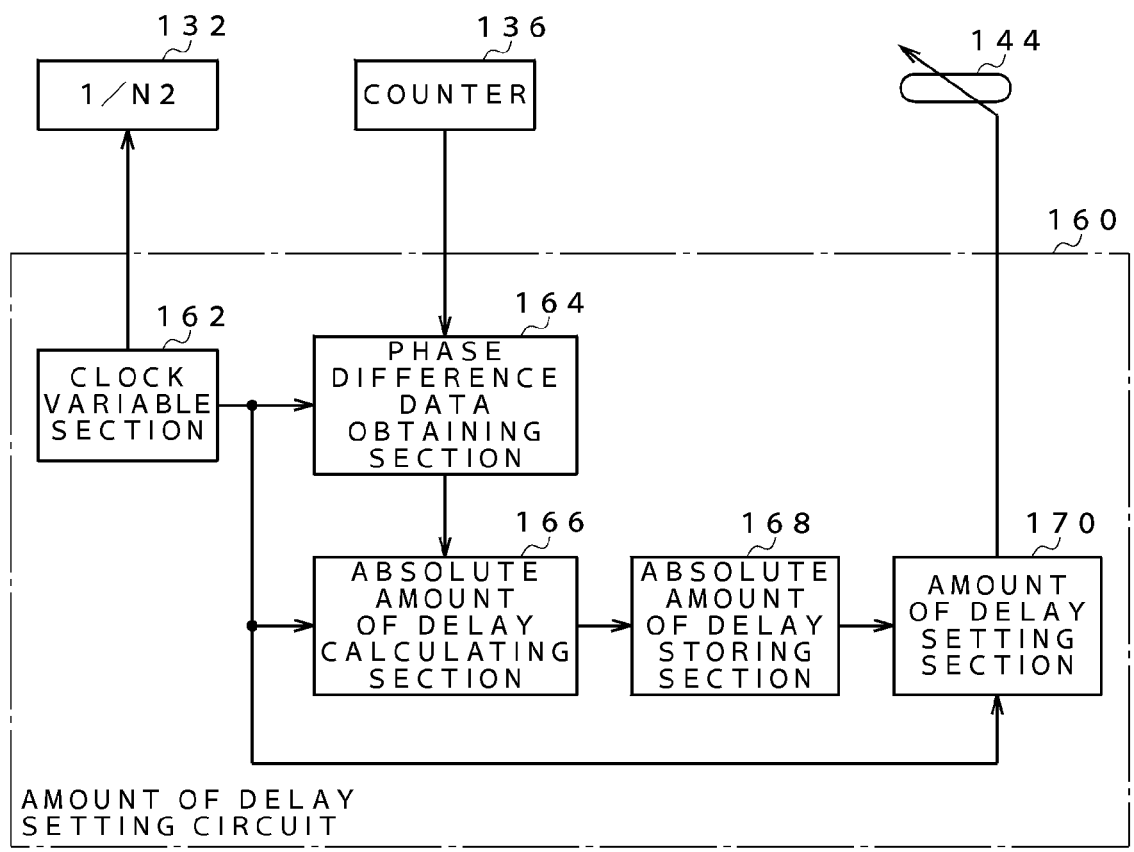
FIG. 2 is a diagram showing a detailed configuration of an amount of delay setting circuit that sets a variable delay circuit based on the absolute amount of delay.

FIG. 2 is a diagram showing a detailed configuration of the amount of delay setting circuit 160 that sets the variable delay circuit 144 based on the absolute amount of delay. As shown in FIG. 2, the amount of delay setting circuit 160 includes a clock variable section 162, a phase difference data obtaining section 164, an absolute amount of delay calculating section 166, an absolute amount of delay storing section 168, and an amount of delay setting section 170.

The clock variable section 162 sets frequency of the regenerative clock generated by the clock generating circuit 120, i.e., oscillation frequency of the voltage controlling type oscillator 128 variable. The setting of the frequency to variable is executed by changing the dividing ratio N2 of the divider 132. The phase difference data obtaining section 164 obtains phase difference data of output timing of data outputted from the level comparator 150 and generating timing of the regenerative clock signal. The phase difference data is the amount of delay obtained from the count value of the counter 136 when the amount of delay of the variable delay circuit 144 is set to 0, and should be set to the variable delay circuit 144. Obtaining of the phase difference data is executed for each of the regenerative clock signal of a plurality of frequencies. The absolute amount of delay calculation section 166 calculates an absolute amount of delay Td based on the phase difference data that is obtained by the phase difference data obtaining section 164. The calculated absolute amount of delay Td is stored in the absolute amount of delay storing section 168. The absolute amount of delay storing section 168 consists of non-volatile memory. The amount of delay setting section 170 calculates the amount of delay ΔT corresponding to the regenerative clock signal of various frequencies and sets the amount of delay of the variable delay circuit 144, based on the absolute amount of delay Td stored in the absolute amount of delay storing section 168.

Figure 3:
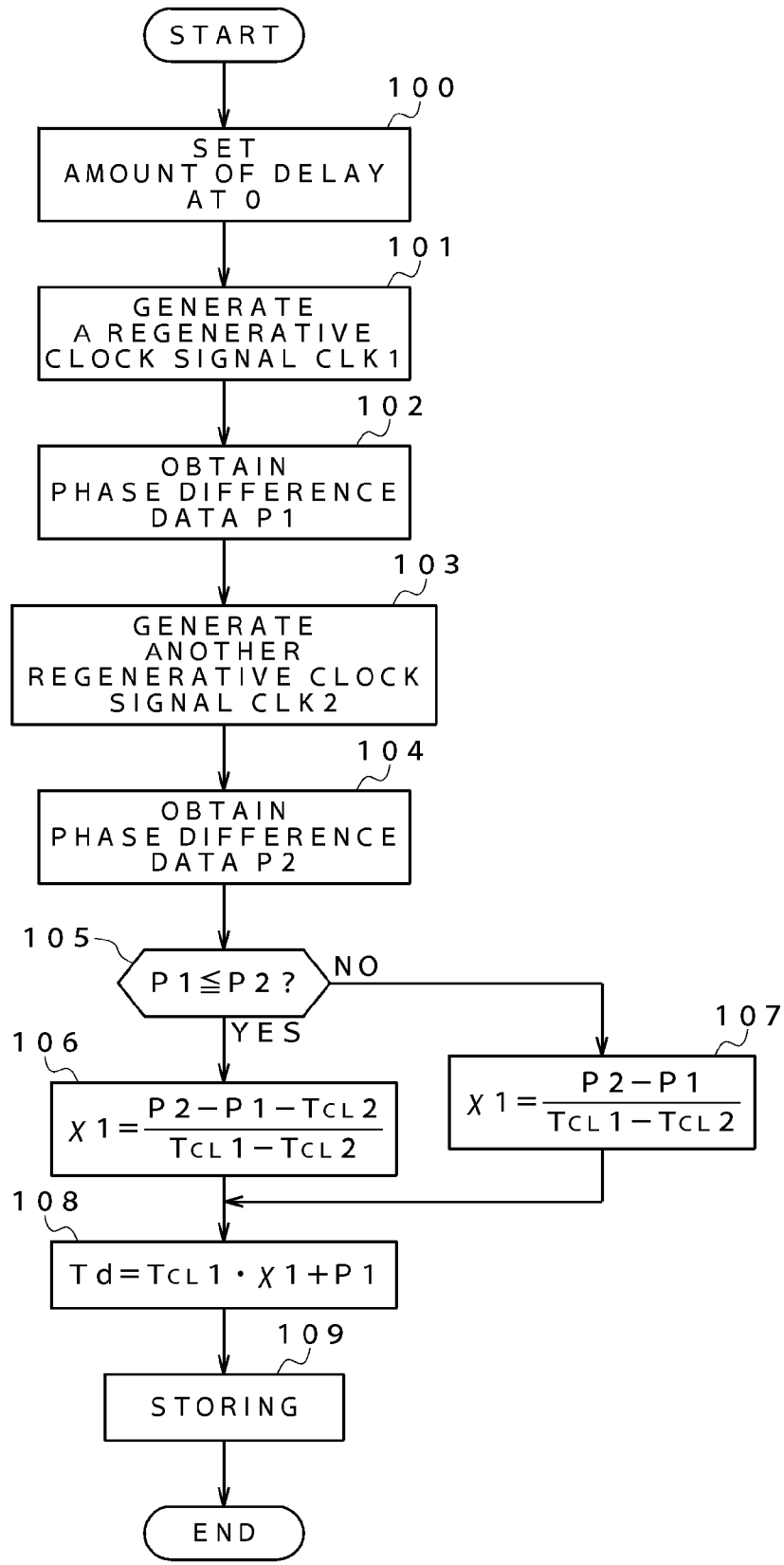
FIG. 3 is a flowchart showing an operation procedure for calculating the absolute amount of delay by the amount of delay setting circuit.
Figure 4:
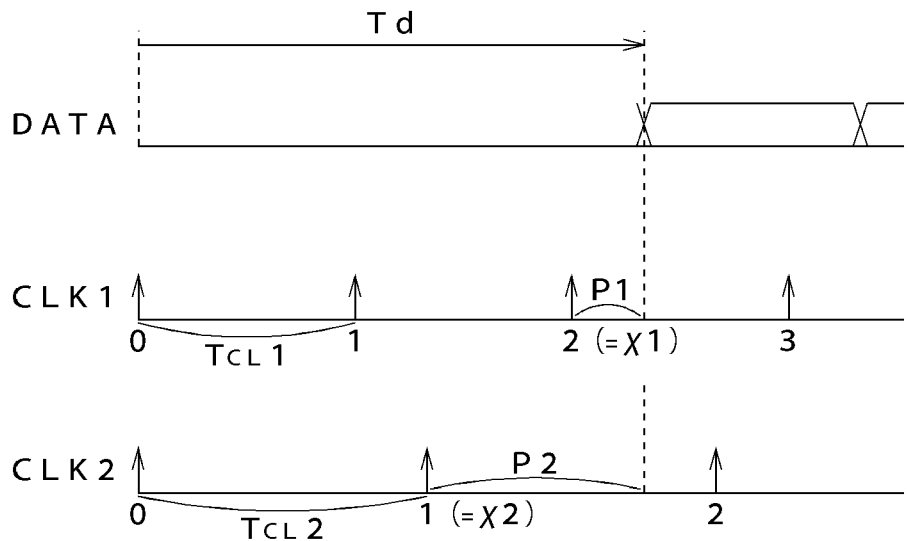
FIG. 4 is a diagram showing an outline of calculating of the absolute amount of delay.

FIG. 3 is a flowchart showing an operation procedure of calculating the absolute amount of delay by the amount of delay setting circuit 160. FIG. 4 is a diagram showing an outline of calculating the absolute amount of delay. In FIG. 4, "CLK1" denotes a regenerative clock signal of lower frequency (short cycle) and "CLK2" denotes a regenerative clock signal of higher frequency (long cycle). "$T_{CL}1$", "$T_{CL}2$" denote periods of respective regenerative clock signals. "x1", "x2" are values of a quotient of the absolute amount of delay Td divided by the period of the respective regenerative clock signal, and "P1", "P2" are remainder values of them. "DATA" denotes data outputted from the level comparator 150.

As shown in FIG. 4, the absolute amount of delay Td is represented by using the period and phase difference data of two kinds of regenerative clock signals as below:

$$Td = T_{CL}1 \cdot x1 + P1 \quad (1)$$

$$Td = T_{CL}2 \cdot x2 + P2 \quad (2).$$

As prerequisites,
(a) the frequency of the regenerative clock signal CLK2 is set so that x2=x1 or x2=x1−1.
(b) the frequency of the regenerative clock signal CLK2 is set so that $T_{CL}2 > T_{CL}1$ and $T_{CL}2 \cdot (x1-1) < T_{CL}1 \cdot x1$.

As the absolute amount of delay Td, which is a difference between line lengths of two signal lines, may be determined at a designing occasion, it is simple to set the regenerative clock signals CLK1, CLK2 to fulfill the two prerequisites (a), (b).

When relationship P1≦P2 is present between the obtained two phase difference data P1, P2, $$x2 = x1 - 1 \quad (3).$$

When x1 is obtained from expressions (1)-(3), the result is $$x1 = (P2 - P1 - T_{CL}2)/(T_{CL}1 - T_{CL}2) \quad (4).$$

When relationship P1>P2 is present between the obtained two phase difference data P1, P2, $$x2 = x1 \quad (5).$$

When x1 is obtained from the expressions (1), (2), (5), the result is $$x1 = (P2 - P1)/(T_{CL}1 - T_{CL}2) \quad (6).$$

In such a manner, x1 is determined so that the absolute amount of delay Td can be calculated by using the expression (1).

In order to execute the calculation, the amount of delay setting section 170 first sets the amount of delay of the variable delay circuit 144 to 0 (step 100). The clock variable section 162 sets the dividing ratio N2 of the divider 132 to a predetermined value. In this manner, a regenerative clock signal CLK1 is generated (step 101). In this state, the phase difference data obtaining section 164 captures the count value of the counter 136 and obtains phase difference data P1 corresponding to the count value (step 102).

Next, the clock variable section 162 changes the dividing ratio N2 of the divider 132. As a result, another regenerative clock signal CLK2 is generated (step 103). In this state, the phase difference data obtaining section 164 captures the count value of the counter 136 and obtains phase difference data P2 corresponding to the count value (step 104).

Next, the absolute amount of delay calculating section 166 determines whether two phase difference data P1, P2 fulfill relationship of P1≦P2 or not (step 105). If it is fulfilled, affirmative decision is made and the absolute amount of delay calculating section 166 calculates x1 by using the expression (4) (step 106). If it is not fulfilled, negative decision is done in the determination at the step 105, and the absolute amount of delay calculation section 166 calculates x1 by using the expression (6) (step 107). Next, the absolute amount of delay calculating section 166 calculates the absolute amount of delay Td by using the expression (1) (step 108) and stores it in the absolute amount of delay storing section 168 (step 109). In this manner, a series of operation for calculating the absolute amount of delay Td ends. Calculating operation of the absolute amount of delay Td is executed once at the moment such as prior to an actual test, or immediately after the change of the signal line is made.

Figure 5:
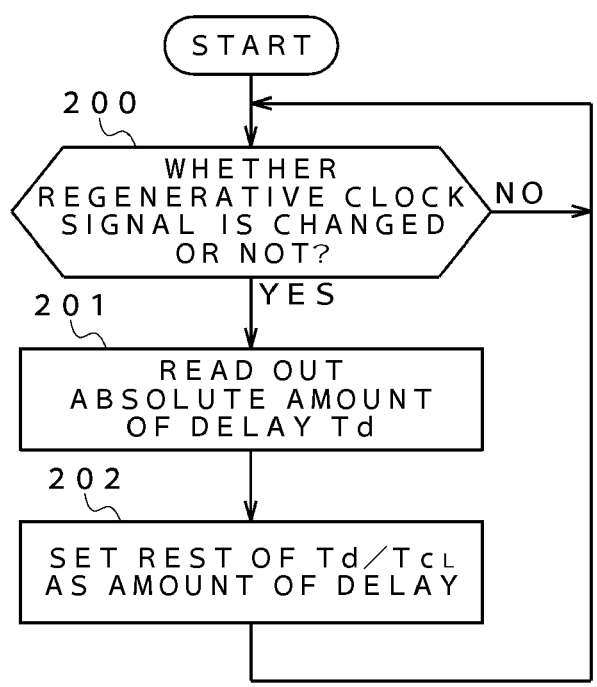
FIG. 5 is a flowchart showing an operation procedure of setting the amount of delay setting when the frequency of regenerative clock signal is changed in testing semiconductor.

FIG. 5 is a flowchart showing an operation procedure of setting the amount of delay when the frequency of the regenerative clock signal is changed during the semiconductor test. The amount of delay setting section 170 determines whether the frequency of the regenerative clock signal is changed or not (step 200). If it is not changed, negative decision is made and the determination is repeated. If the frequency of the regenerative clock signal is changed, affirmative decision is made in the determination at the step 200 and, next, the amount of delay setting section 170 reads the absolute amount of delay Td stored in the absolute amount of delay storing section 168 (step 201) and sets a remainder of dividing the absolute amount of delay Td by a period $T_{CL}$ of a changed regenerative clock signal as an amount of delay of the variable delay circuit 144 (step 202). Then, the operation returns to the step 200 and the processing is repeated.

As described above, in the semiconductor testing apparatus of the embodiment, if only the absolute amount of delay Td is known, the amount of delay ΔT required for the adjustment of the generating timing of the regenerative clock signal is known by calculation when a frequency or a period of the regenerative clock signal is changed. Therefore, effort for adjusting the generating timing of the regenerative clock signal to be extracted from data or time required for the adjustment can be significantly reduced. Particularly, it can calculate the absolute amount of delay Td only by actually generating two kinds of regenerative clock signals and obtaining data of phase difference between the regenerated clock signals, and it can reduce effort and time for setting the amount of delay by actually generating the regenerative clock signal each time when the frequency or the period of the regenerative clock signal is changed thereafter. It can further reduce effort and time in setting the amount of delay as it can keep once calculated data of the absolute amount of delay by storing the calculated absolute amount of delay in the absolute amount of delay storing section 168 that consists of non-volatile memory and use it in each time of setting the amount of delay.

The present invention is not limited to the abovementioned embodiment, and various modifications are possible in the scope of the spirit of the present invention. Although the variable delay circuit 144 is provided between the phase comparing device 134 and the divider 130 in the abovementioned embodiments, the variable delay circuit 144 may be provided between the phase comparing device 134 and the level comparator 150 depending on the length or the like of the signal line.

What is claimed is:

1. A semiconductor testing apparatus comprising:
   a receiving unit for receiving data outputted from a DUT;
   a clock generating unit for generating a clock signal synchronized with data outputted from said DUT;
   an absolute amount of delay calculating unit for calculating a signal propagating time corresponding to a difference between a first signal line from said DUT to said receiving unit and a second signal line from said DUT to said clock generating unit as an absolute amount of delay; and
   an amount of delay setting unit for setting the amount of delay under a period of the clock signal according to a frequency or a period of said clock signal generated by said clock generating unit and ordering adjustment of said clock signal generating timing by said clock generating unit.

2. The semiconductor testing apparatus according to claim 1, further comprising:
   a phase difference data obtaining unit for obtaining a first phase difference data P1 indicating a phase difference between output timing of said data which is generated when a first clock signal having a first frequency or a first period is generated by said clock generating unit and said first clock signal generating timing, and a second phase difference data P2 indicating a phase difference between output timing of said data which is generated when a second clock signal having a second frequency or a second period which is different from said first frequency or said first period is generated by said clock generating unit and said second clock signal generating timing, wherein said absolute amount of delay calculating unit calculates said absolute amount of delay based on said first and second phase difference data P1, P2 obtained by said phase difference data obtaining unit and said first and second frequencies or said first and second periods.

3. The semiconductor testing apparatus according to claim 1, wherein the absolute amount of delay calculated by said absolute amount of delay calculating unit is stored in an absolute amount of delay storing unit consisting of non-volatile memory.

4. The semiconductor testing apparatus according to claim 2, further comprising:
   a phase comparing unit for detecting a phase difference of signals inputted into two input terminals, wherein data outputted from said DUT is inputted into an input terminal and said first and second clock signals generated by said clock generating unit are inputted into the other input terminal; and a phase difference outputting unit for outputting a value corresponding to the phase difference detected by said phase comparing unit; and wherein said phase difference data obtaining unit obtains said first and second phase difference data based on the value outputted from said phase difference outputting unit.

5. The semiconductor testing apparatus according to claim 4, wherein said phase difference outputting unit consists of a counter for performing up-count operation or down-count operation according to the phase difference detected by said phase comparing unit and outputs a count value depending on said phase difference.

6. The semiconductor testing apparatus according to claim 4, wherein said clock generating unit comprises a PLL synthesizer for generating said clock signal, and an adding unit for superimposing a voltage depending on the value outputted from said phase difference outputting unit on a control voltage to be applied to a voltage controlling type oscillator in said PLL synthesizer.

7. The semiconductor testing apparatus according to claim 2, wherein said absolute amount of delay calculating unit compares the size of said first and second phase difference data P1, P2, and calculates said absolute amount of delay according to the result of the comparison.

8. The semiconductor testing apparatus according to claim 2, wherein said absolute amount of delay calculating unit calculates said absolute amount of delay by comparing the size of said first and second phase difference data P1, P2 and obtaining a quotient resulted from division of said absolute amount of delay by a period of said first or second clock signal according to the result of the comparison.

* * * * *